(12) United States Patent
Benzel et al.

(10) Patent No.: US 8,232,126 B2
(45) Date of Patent: Jul. 31, 2012

(54) MANUFACTURING METHOD FOR A MICROMECHANICAL COMPONENT, CORRESPONDING COMPOSITE COMPONENT, AND CORRESPONDING MICROMECHANICAL COMPONENT

(75) Inventors: Hubert Benzel, Pliezhausen (DE); Frank Henning, Reutlingen (DE); Armin Scharping, Metzingen (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/737,036

(22) PCT Filed: Apr. 21, 2009

(86) PCT No.: PCT/EP2009/054695
§ 371 (c)(1),
(2), (4) Date: Feb. 22, 2011

(87) PCT Pub. No.: WO2009/149979
PCT Pub. Date: Dec. 17, 2009

(65) Prior Publication Data
US 2011/0163396 A1 Jul. 7, 2011

(30) Foreign Application Priority Data

Jun. 9, 2008 (DE) .......................... 10 2008 002 307

(51) Int. Cl.
*H01L 21/00* (2006.01)
(52) U.S. Cl. ............. 438/53; 257/254; 257/419; 73/715
(58) Field of Classification Search .................. 257/254, 257/419, E29.324; 438/48, 51–53; 73/708, 73/715, 721, 727
See application file for complete search history.

(56) References Cited

U.S. PATENT DOCUMENTS

| 4,840,067 A | 6/1989 | Nishida et al. |
| 5,191,798 A * | 3/1993 | Tabata et al. .................... 73/727 |
| 7,404,330 B2 | 7/2008 | Uchigashima et al. |

FOREIGN PATENT DOCUMENTS

| DE | 199 34 114 | 1/2001 |
| DE | 100 36 284 | 2/2002 |
| DE | 103 50 036 | 5/2005 |
| DE | 10 2005 035 057 | 2/2007 |
| DE | 10 2007 012 106 | 9/2007 |
| WO | WO 2005/040747 | 5/2005 |

* cited by examiner

*Primary Examiner* — David Vu
(74) *Attorney, Agent, or Firm* — Kenyon & Kenyon LLP

(57) ABSTRACT

A manufacturing method for a micromechanical component, a corresponding composite component, and a corresponding micromechanical component are described. The method has the following steps: providing a first composite of a plurality of semiconductor chips, the first composite having first front and back surfaces; providing a second composite of a corresponding plurality of carrier substrates, the second composite having second front and back surfaces; imprinting a structured adhesion promoter layer on the first front and/or second front surfaces, the layer having degassing channels; aligning the first front and second front surfaces corresponding to a plurality of micromechanical components, each having a semiconductor chip and a corresponding carrier substrate; connecting the first front and second front surfaces via the structured adhesion promoter layer by applying pressure so that a gas from the ambient atmosphere is able to escape to the outside through the degassing channels; and separating the micromechanical components.

13 Claims, 8 Drawing Sheets

MANUFACTURING METHOD FOR A MICROMECHANICAL COMPONENT, CORRESPONDING COMPOSITE COMPONENT, AND CORRESPONDING MICROMECHANICAL COMPONENT

BACKGROUND OF THE INVENTION

1. Field of the Invention

The present invention relates to a manufacturing method for a micromechanical component, a corresponding composite component, and a corresponding micromechanical component.

2. Description of Related Art

Without limiting generality, the present invention and its underlying technical objective are explained on the basis of high-pressure sensor elements, whereby one or multiple thin silicon chips, with or without an integrated evaluation circuit, are soldered onto a steel substrate having a steel diaphragm.

As is known from published German patent application document DE 10 2007 012 106 A1, the circuit and connection side of the silicon chips is situated on the side facing away from the steel diaphragm. A glass solder (also referred to below as "seal glass"), for example, is used as the solder. This technology is known, for example, as "pattern transfer." However, there are various challenges with regard to processing. Multiple complex changes between front and back side processing of the chips are required. The handling of the small to very small chips used is complicated. Multiple complex changes between wafer processes, individual chip processes (soldering), and batch processes are necessary. Lastly, special measures are required in order to minimize cavity formation during soldering.

Published German patent application document DE 100 36 284 A1 describes a high-pressure sensor element in which at least one measuring element in the form of a strain gauge is mounted on a diaphragm, the measuring element being separated from the diaphragm by an electrically insulating layer. The measuring element is mounted on an electrically insulating substrate, which in a further step is fastened to the side of the diaphragm facing away from the measuring element, so that the electrically insulating substrate forms the electrically insulating layer.

Published German patent application document DE 10 2007 012 106 A1 discloses a pressure sensor having a metal housing and a semiconductor chip. The housing has a diaphragm formed in one piece with the housing, and an inlet for supplying a fluid to the diaphragm.

Published German patent application document DE 103 50 036 A1 and published German patent application document DE 10 2005 035 057 A1 each describe a method for manufacturing a semiconductor chip system, a plurality of semiconductor chips being connected to a carrier substrate via thin webs or support points on the back side. The webs are made of silicon, for example, and are surrounded by a cavity in the manufacturing process. Using an etching process which is selective for the carrier substrate and the semiconductor chips, the webs may be dissolved, thus separating the semiconductor chips from the carrier substrate.

Published German patent application document DE 199 34 114 A1 describes a substrate and a workpiece carrier for accommodating a plurality of such substrates for forming a composite substrate.

SUMMARY OF THE INVENTION

The manufacturing method for a micromechanical component, the composite component, and the corresponding micromechanical component of the present invention have the advantage that the micromechanical components in question may be manufactured easily, reliably, and in particular without cavities, using only wafer processes or a combination of wafer and batch processes. The minimization of cavity formation during soldering allows degassing channels in the printed seal glass structures, and, if necessary, a convex shape of the chips during soldering. This increases the stability of the electrical components. The manufacturing may be simplified and made more cost-effective by using composite substrates instead of individual substrates.

The outer contour of the chip and the separated substrate may be matched to one another using separating processes for nonlinear contours within the composite structure. This allows a high utilization of surface area in the semiconductor wafer when at the same time the separated substrate has a favorable mounting geometry (round, polygonal, or rectangular, for example). In addition, the method according to the present invention has excellent shrinkage capabilities.

The underlying concept of the present invention involves applying a structured bonding promoter layer, for example by imprinting, on the first front surface and/or the second front surface, the front surface(s) having degassing channels, whereby within the composite structure, each semiconductor chip is connected, essentially free of cavities, to a corresponding carrier substrate corresponding to a respective micromechanical component, so that during the connection process step a gas from the ambient atmosphere is able to escape to the outside through the degassing channels. According to one preferred refinement, the first composite is a wafer composite.

According to another preferred refinement, the wafer composite is designed in such a way that the semiconductor chips are connected to a main wafer element via one or multiple support points, each of which is surrounded by a cavity. By using porous silicon, for example, such low-defect, thin silicon chips may be manufactured without the need for back-grinding, polishing, or plasma etching method steps. Greatly simplified handling is made possible by using the source wafer as a carrier of such thin silicon chips instead of using back-thinning, lamination, and multiple transfer lamination processes.

According to another preferred refinement, the connection step includes a thermal and/or mechanical step in which the support points break, thereby separating the main wafer element from the semiconductor chips.

According to another preferred refinement, the first composite is designed in such a way that the plurality of semiconductor chips is provided on a dicing tape.

According to another preferred refinement, the second composite is a wafer composite. The handling and adjustment of the substrates is simplified by using such large substrates instead of individual substrates and workpiece carrier systems.

According to another preferred refinement, the second composite is designed in such a way that the plurality of carrier substrates is connected with the aid of a carrier device.

According to another preferred refinement, the bonding promoter layer is a seal glass layer, which for the connection is heated to a temperature in the range of 100° C. to 500° C. The soldering may be simplified and made more cost-effective by using wafer seal glass bonding instead of individual chip bonding using a "pick and place" tool. Chip defects in seal glass bonding may be avoided by introducing the pressing force via the back side of the chip instead of on the front side of the chip, using a pick and place tool.

According to another preferred refinement, the bonding promoter layer (SG) has a pressure pattern having multiple separate structures (SGS) having first degassing channels (SK), the separate structures (SGS) being separated by second degassing channels (KG).

According to another preferred refinement, the carrier substrates are steel substrates.

According to another preferred refinement, each semiconductor chip has an integrated circuit on its first front surface, the first front surface being connected to the second front surface via the structured bonding promoter layer.

According to another preferred refinement, a step of through contacting of the semiconductor chips, starting from the first back surface, is carried out after the connection and before the separation.

According to another preferred refinement, a step of thinning the first composite of the plurality of semiconductor chips at the first back surface is carried out before the through contacting.

BRIEF DESCRIPTION OF DRAWINGS

Exemplary embodiments of the present invention are illustrated in the drawings and explained in greater detail in the following description.

DETAILED DESCRIPTION OF THE INVENTION

Figure 1A:
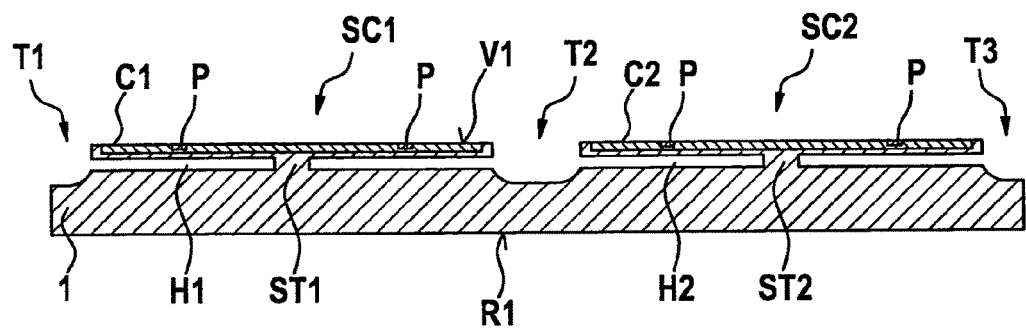
FIGS. 1a,b through FIGS. 4a, b show schematic cross-sectional views for explaining a manufacturing method for a micromechanical component according to a first specific embodiment of the present invention.

Similar or functionally identical components are denoted by the same reference numerals in the figures.

Figure 4A:
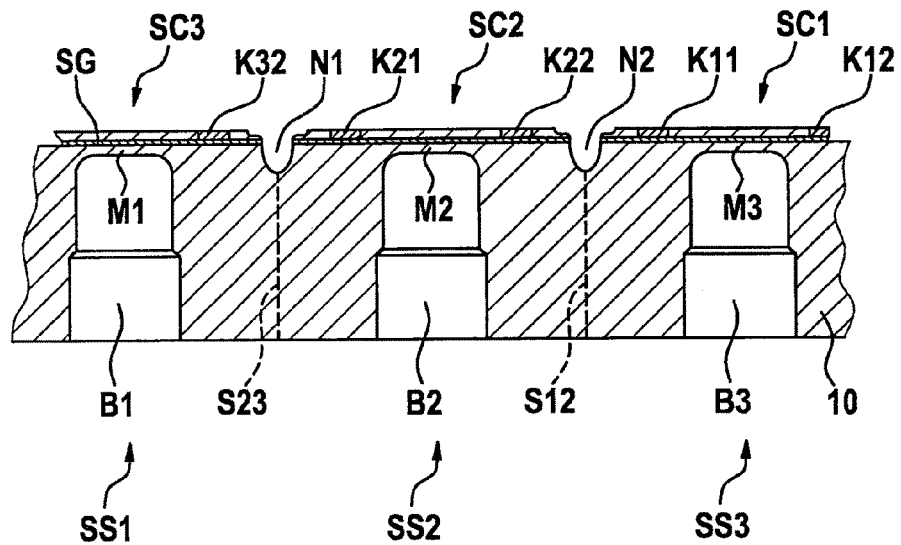

FIGS. 1a, b through FIGS. 4a, b show schematic cross-sectional views for explaining a manufacturing method for a micromechanical component according to a first specific embodiment of the present invention.

In FIGS. 1a, b, reference numeral 1 denotes a main silicon wafer element of a silicon wafer W1 to which thin silicon sensor chips SC1, SC2, . . . are connected via a respective web or support point ST1, ST2, . . . .

Figure 1B:
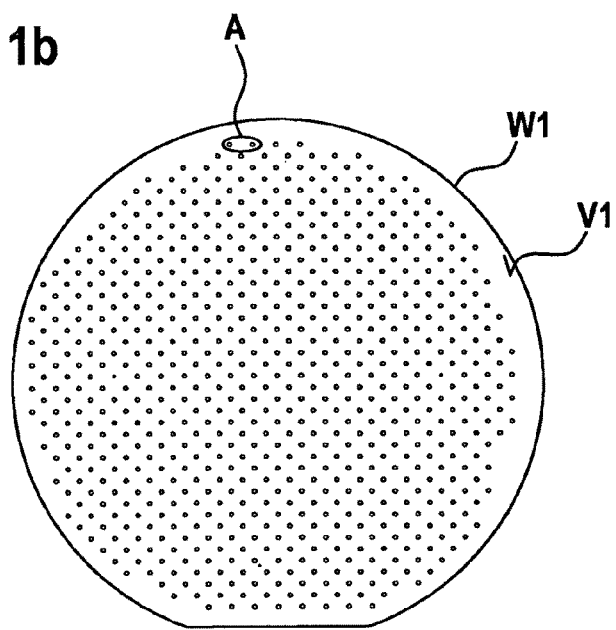

It is apparent from FIG. 1b that FIG. 1a represents detail A of wafer W1 according to FIG. 1b. On their front side, silicon sensor chips SC1, SC2, . . . have an integrated circuit C1 and C2, respectively, in which a piezosensitive device P used for pressure detection is provided. Support points ST1, ST2, . . . are made of silicon, and are manufactured, for example, according to the method described in DE 10 2005 035 057 A1. Support points ST1, ST2, . . . are surrounded by a respective cavity H1 and H2, etc.

Silicon sensor chips SC1, SC2 situated above respective cavity H1, H2 have a particularly thin design so that they will be suitable as high-pressure sensor elements. Support points ST1, ST2, . . . made of silicon fix silicon sensor chips SC1, SC2, . . . during the semiconductor and micromechanical processes to be carried out within the composite structure. One preferred configuration of support points ST1, ST2, . . . is in the middle region of silicon sensor chips SC1, SC2, . . . . Multiple support points may also be provided for each chip.

Using such a system, during front-side dry etching for producing separating trenches T1, T2, T3, as the result of internal stresses silicon sensor chips SC1, SC2, . . . may assume a slightly convex shape; i.e., the lateral ends of silicon sensor chips SC1, SC2, . . . are situated closer to main wafer element 1 than is the middle region. The convex shape thus avoids gas inclusions and cavities during a seal glass bonding process to be subsequently carried out, described in greater detail below. Separating trenches T1, T2, T3 provided between silicon sensor chips SC1, SC2, . . . extend to main wafer element 1. The separating trenches should be provided with a predefined minimum width and depth which allow the thermal expansion and meniscus formation for the seal glass wafer bonding to be subsequently carried out.

The system according to FIGS. 1a, b is thus a first composite of a plurality of semiconductor chips SC1, SC2, . . . the first composite having a first front surface V1 and a first back surface R1. First front surface V1 is formed by the totality of the front surfaces of silicon sensor chips SC1, SC2, . . . , as illustrated in FIG. 1b.

Separating trenches T1, T2, T3, which are produced using the front-side dry etching process, may be provided in any desired shape. The shape of silicon sensor chips SC1, SC2, . . . may therefore be adapted to the desired shape of the carrier substrates, which in this case are made of steel, for example, and which are to be connected in this way.

Figure 2A:
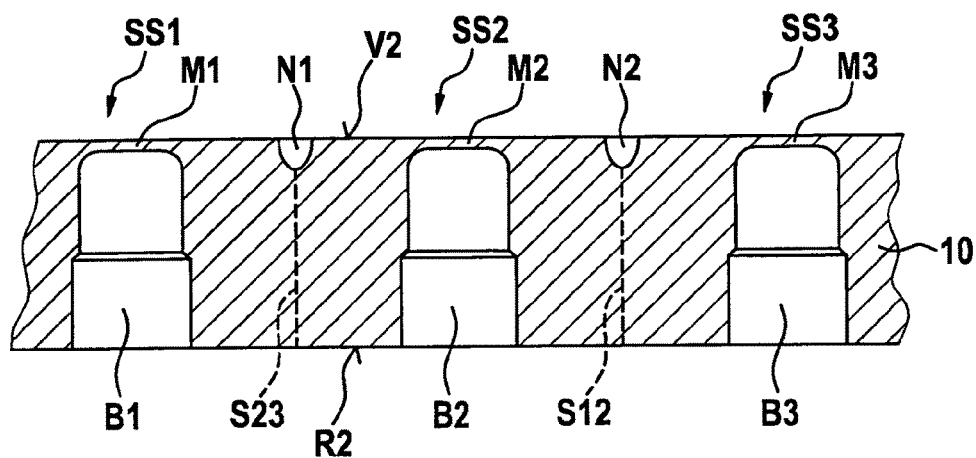

In FIGS. 2a, b, reference numeral 10 denotes a carrier substrate main element made of steel which is present in the form of a wafer W2, wafer W2 preferably having the same dimensions as wafer W1 described in conjunction with FIGS. 1a, b. Wafer W2 has a second front surface V2 and a second back surface R2.

Figure 2B:
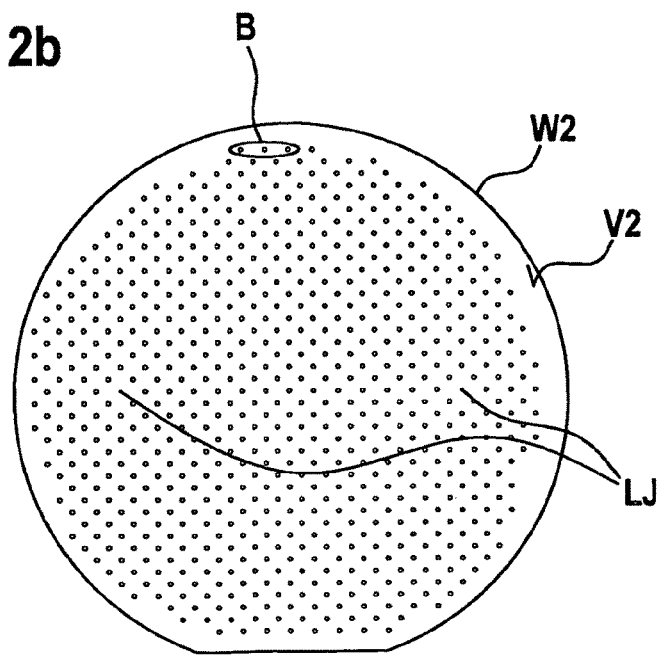

Detail B from FIG. 2b is illustrated in FIG. 2a. A plurality of high-pressure diaphragms M1, M2, M3, . . . is provided on second front surface V2 via boreholes B1, B2, B3, . . . on the back side. The grid of high-pressure diaphragms M1, M2, M3, . . . corresponds to the grid of silicon chips SC1, SC2, . . . on silicon wafer W1.

In order to adjust stainless steel wafer W2 during the seal glass bonding which is to be subsequently carried out, for connection to silicon wafer W1 stainless steel wafer W2 has two visually evaluatable adjustment holes LJ which are provided in the grid of high-pressure diaphragms M1, M2, M3 . . . and which are produced together with same. Very good positional accuracy of adjustment holes LJ with respect to diaphragms M1, M2, M3, . . . and diaphragm boreholes B1, B2, B3, . . . is ensured by this joint mechanical production, for example in a clamping device.

Also provided on second front surface V2 are grooves N1, N2 which allow simplification of the subsequent separation of individual steel carrier substrates SS1, SS2, SS3, . . . by sawing along saw lines S12, S23, . . . and of the subsequent mounting by laser welding.

Thus, stainless steel wafer W2 contains a second composite of a plurality of carrier substrates SS1, SS2, SS3, . . . , the second composite having second front surface V2 and second back surface R2, and in a subsequent method step second front surface V2 being connected to silicon sensor chips SC1, SC2, . . . in the composite of wafer W1.

Figure 3A:
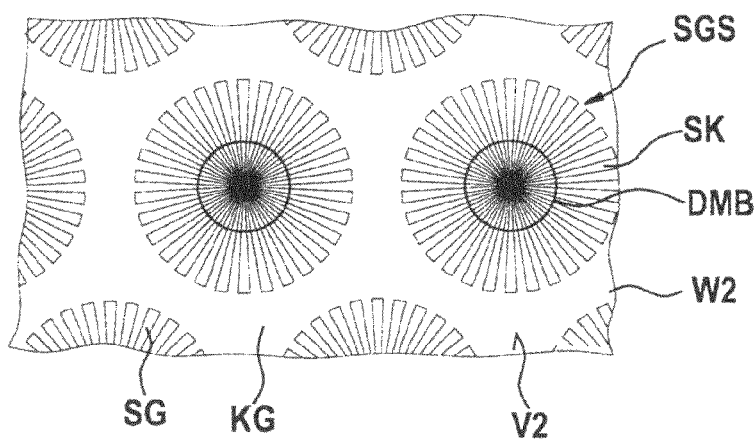

FIGS. 3a, b illustrate the step of imprinting a structured seal glass layer SG on second front surface V2 of stainless steel wafer W2 (FIG. 3a), and the step of connecting wafers W1 and W2 via seal glass layer SG.

The imprinting according to FIG. 3a is carried out using screen printing or dispensing, for example. Individual seal glass structures SGS which are separated from one another by wide degassing channels KG are designed in such a way that a seal glass structure having narrow degassing channels SK for low-cavity seal glass bonding of silicon chips SC1, SC2, . . . is present at each position of a stainless steel diaphragm M1, M2, M3, . . . . Narrow degassing channels SK open into wide degassing channels KG. Wide degassing channels KG allow the gases to be completely discharged to the outside via the wafer edge of superposed wafers W1, W2, since the degassing channels lead to that location. Examples of design options for degassing channels SK include a pie segment-shaped structure, a strip-shaped structure, and a gridded structure, or the like.

Reference character DMB in FIG. 3a denotes the diameter of steel diaphragms M1, M2, M3, . . . . It is apparent from the figure that the diameter of seal glass structures SGS is larger than that of steel diaphragms M1, M2, M3, . . . , since the diameter of silicon sensor chips SC1, SC2, SC3, . . . is also larger than that of steel diaphragms M1, M2, M3, . . . . The diameter of seal glass structures SGS essentially corresponds to the diameter of silicon sensor chips SC1, SC2, SC3.

Additionally or alternatively, silicon wafer W1 may be imprinted with such seal glass structures SGS.

Figure 3B:
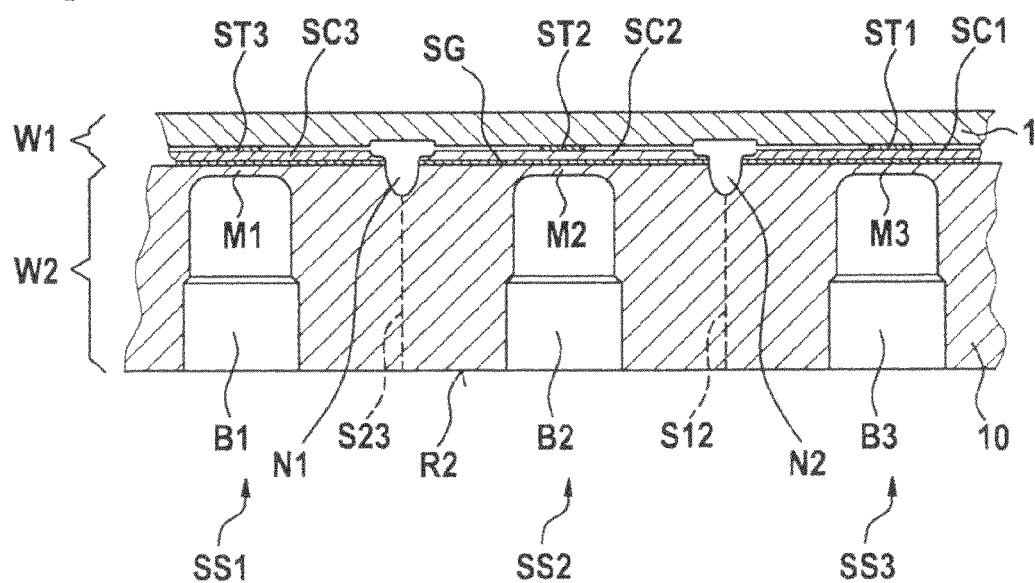

Adjustment holes LJ of stainless steel wafer W2 are used for visually aligning seal glass structures SGS. After wafers W1, W2 are aligned according to the plurality of micromechanical components to be formed, each having a silicon sensor chip and a corresponding carrier substrate made of steel, first front surface V1 is connected to second front surface V2 via structured seal glass layer SG in order to form a corresponding composite of micromechanical components, as illustrated in FIG. 3b.

The connection is established using the known technique of seal glass wafer bonding, at temperatures of 100° C. to 500° C. and using an appropriately selected pressure force, for example using an appropriate punch, thus making it possible to avoid cavities between diaphragms M1, M2, M3, . . . and sensor chips SC1, SC2, SC3, . . . . Support points ST1, ST2, ST3, . . . are selectively separated as a result of the mechanical pressure force during the seal glass wafer bonding, by using a thermomechanical splitting process during cooling during the seal glass wafer bonding, with different coefficients of thermal expansion of silicon wafer W1 and of stainless steel wafer W2, or by using a mechanical force action or a chemical attack on support points ST1, ST2, ST3, . . . , thus detaching the firm connection of main wafer element 1 to silicon sensor chips SC1, SC2, SC3, . . . . This separation allows displacements, and thus cooling of stainless steel wafer W2 and the soldered-on silicon sensor chips SC1, SC2, SC3, . . . with low internal stress. After cooling, main wafer element is easily lifted off the structure that is formed.

FIG. 4a shows the state after main wafer element 1 is lifted off, and back sides of silicon sensor chips SC1, SC2, SC3, . . . are optionally smoothed.

In a subsequent process step also shown in FIG. 4a, backside through contacting of silicon sensor chips SC1, SC2, SC3 is carried out, whereby, starting from the back side, contact holes K11, K12, K21, K22, K32 . . . are formed in order to connect a printed conductor device L1, L2 of the respective integrated circuit, provided in the front side of semiconductor chips SC1, SC2, SC3, from the back side of semiconductor chips SC1, SC2, SC3, . . . .

Figure 4B:
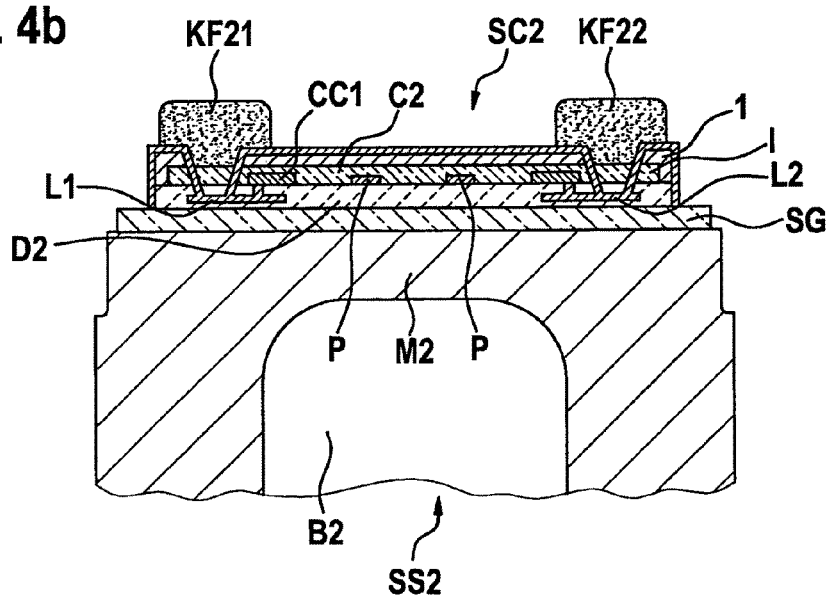

FIG. 4b is an enlarged detailed view for explaining the back-side through contacting of silicon sensor chip SC2.

For contacting printed conductors L1, L2, which are provided in a front thin-layer ceramic D2 (for the first specific embodiment, shown only in FIG. 4b) of circuit C2, the back side of silicon sensor chip SC2 is provided with an appropriate resist mask (not illustrated), after which an appropriate dry etch process for contact holes K21, K22 is carried out up to printed conductors L1, L2, using an appropriate etch stop, for example.

Producing the resist mask is made more difficult by the topography of stainless steel wafer W2, which has soldered-on silicon sensor chips SC1, SC2, SC3, . . . . For this reason a spray coating is preferably used, thus producing large contacts, for example for conductive adhesive contacting, having less stringent demands for structural precision. After the dry etch step, an insulating layer I is deposited on the back side of silicon sensor chips SC1, SC2, SC3, and contact holes K21, K22 are opened toward printed conductors L1, L2 using lithography once again, followed by dry etching with etch stop in printed conductors L1, L2.

Conductive adhesive contact fillings KF21, KF22 are then filled into contact holes K21, K22, resulting in the process state according to FIG. 4b.

It should also be pointed out that printed conductors L1, L2 are connected to circuit connection regions CC1 and CC2, respectively, of integrated circuit C2, which in turn are connected to piezoelectric device P via further printed conductors and other electronic components (not shown).

Following the process state according to FIGS. 4a, b, the composite component is separated into the components, each of which is composed of a silicon sensor chip and a carrier substrate made of steel. For this purpose, a sawing process is carried out along respective saw lines S12, S23, . . . . Laser water jet cutting, for example, may be used for the sawing, producing a suitable outer contour, a round contour, for example, for welding the sensor components to a connecting element. During and after the separation, the separated components are handled on a fiberglass tape or other suitable carrier (not shown).

Figure 5:
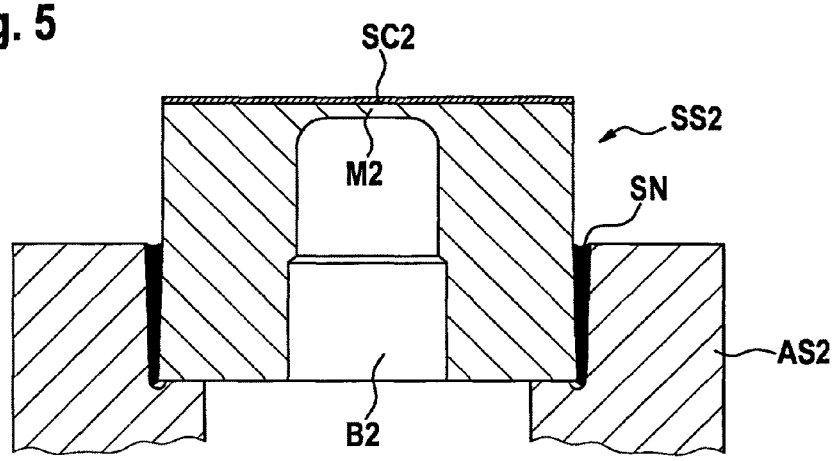
FIG. 5 shows a schematic cross-sectional view for explaining an installation design for a micromechanical component according to the first specific embodiment of the present invention.

FIG. 5 shows a schematic cross-sectional view for explaining an installation design for a micromechanical component according to the first specific embodiment of the present invention.

As illustrated in FIG. 5, for the installation the sensor component, composed of carrier substrate SS2 and silicon sensor chip SC2, is welded to a connecting element AS2 by beam welding at the circumference, thus forming weld seam SN. As a result of the circumferential welding, during operation weld seam SN is preferably acted on by pressure stresses, which allows the sensor in question to be durably designed for particularly high pressures. By welding only in the lower area of the sensor component, the distance of the thermal weld influx zone from silicon sensor chip SC2 may be kept relatively large.

Following the process state explained in conjunction with FIG. 5, the sensor components are adjusted as a function of pressure and temperature. A sensor component without an evaluation electronics system is adjusted in the associated ASIC (two-chip approach), and sensor elements having an integrated evaluation electronics system may be adjusted with the aid of thyristor zapping or zener zapping.

Fuel injection systems, air conditioning systems, and geared transmission systems are mentioned as examples of applications for the high-pressure sensors designed in this manner.

Figure 6:
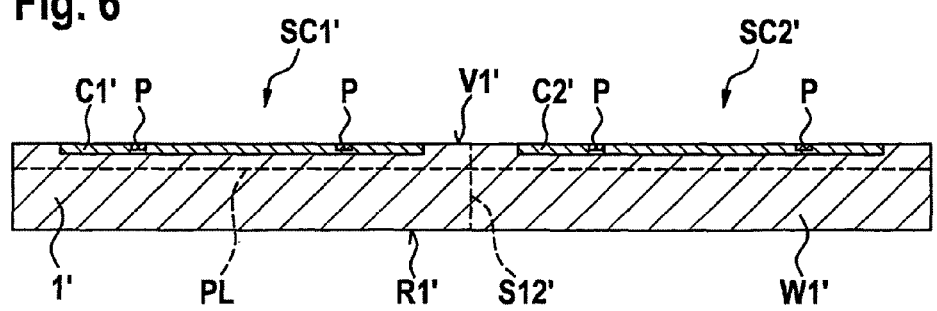
FIG. 6 shows a schematic cross-sectional view for explaining a manufacturing method for a micromechanical component according to a second specific embodiment of the present invention.

FIG. 6 shows a schematic cross-sectional view for explaining a manufacturing method for a micromechanical component according to a second specific embodiment of the present invention.

In the second specific embodiment illustrated in FIG. 6, the first composite of the plurality of semiconductor chips SC1, SC2', . . . differs in that each semiconductor chip SC1', SC2', . . . is completely integrated into main wafer element 1' of a wafer W1'; i.e., no support points made of silicon are present as in the first specific embodiment.

Wafer W1' has a first front surface V1' and a first back surface R1'. The design of circuits C1', C2' in sensor chips SC1', SC2' corresponds to the design of circuit regions C1, C2, including piezoelectric device P, which has been explained in conjunction with FIGS. 1a, b.

In addition, in FIG. 6 reference character PL denotes a polishing line to which W1' is thinned, starting from second back surface R1', after the seal glass wafer bonding of surface V1' on surface V2 of stainless steel wafer W2, in order to achieve the required small thickness of silicon sensor chips SC1', SC2', . . . . It should be noted that the back-thinning of wafer W1' starting from second back surface R1' may be carried out by etching or chemical-mechanical ablation, for example. Lastly, reference character S12' denotes a line for a separation process, carried out by sawing, for example. In contrast to the first specific embodiment, in this separation process main wafer element 1' of wafer W1' may also be cut through concurrently with stainless steel wafer W2.

Figure 7:
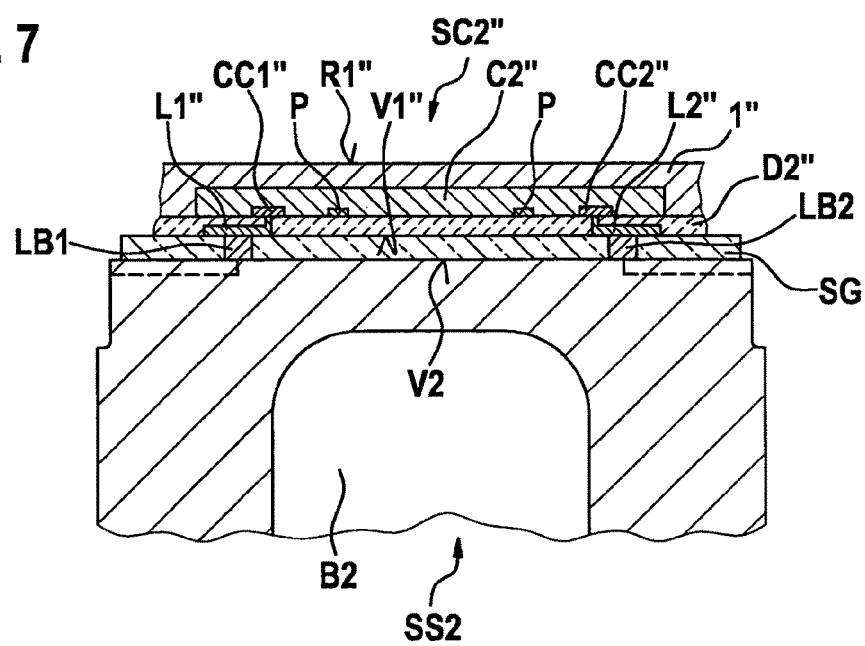
FIG. 7 shows a schematic cross-sectional view for explaining a manufacturing method for a micromechanical component according to a third specific embodiment of the present invention.

FIG. 7 shows a schematic cross-sectional view for explaining a manufacturing method for a micromechanical component according to a third specific embodiment of the present invention.

In the third specific embodiment according to FIG. 7, in contrast to the first specific embodiment described above there is no back-side through contacting of silicon sensor chip SC2", situated at that location, from back surface R1" thereof; rather, there is simultaneous seal glass wafer bonding of front surface V1" and simultaneous soldering of solder bumps LB1, LB2, which are provided on printed conductors L1", L2" on the circuit side in thin-layer ceramic D2", on corresponding printed conductors which are provided in an isolated manner in or on surface V2 of carrier substrate SS2 (indicated by dashed lines). The same as for the first specific embodiment, printed conductors L1" and L2" are connected to corresponding circuit connection regions CC1", CC2" of integrated circuit C2"

Figure 8A:
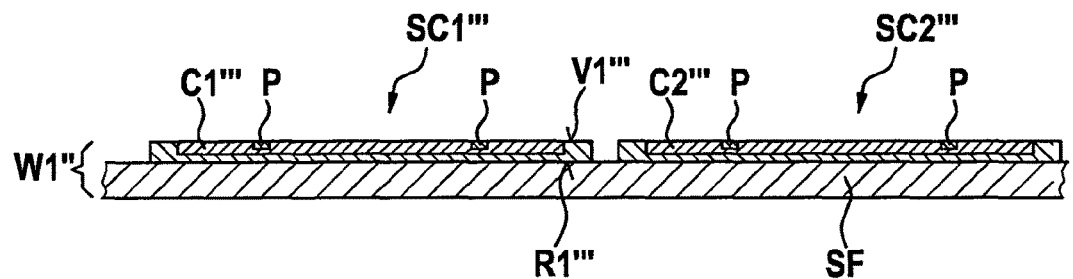
FIGS. 8a, b show schematic cross-sectional views for explaining a manufacturing method for a micromechanical component according to a fourth specific embodiment of the present invention.

FIGS. 8a, b show schematic cross-sectional views for explaining a manufacturing method for a micromechanical component according to a fourth specific embodiment of the present invention.

Figure 8B:
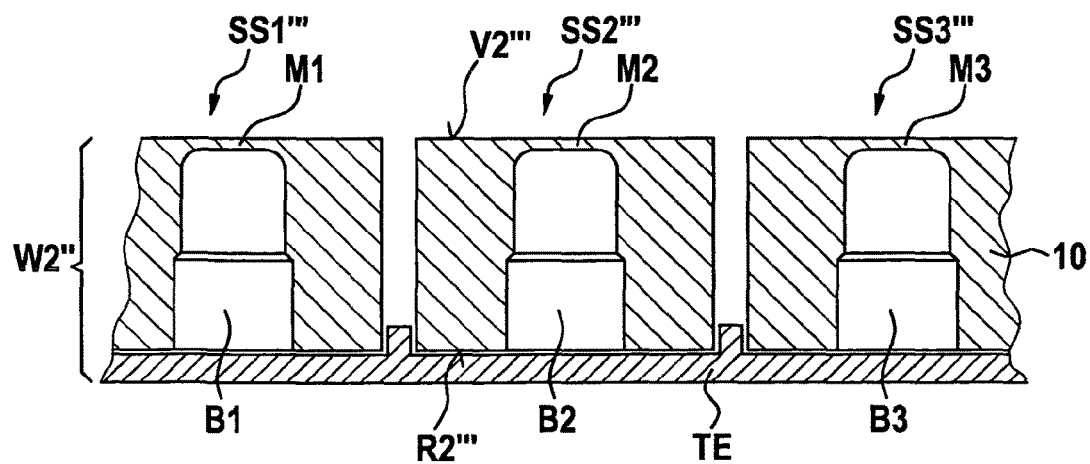

In the fourth specific embodiment according to FIG. 8, the first composite of the plurality of semiconductor chips SC1''', SC2''', . . . is provided on a bordered dicing tape SF in a composite W1"; silicon sensor chips SC1''', SC2''', . . . have circuit regions CC1''', CC2''', . . . which correspond to circuit regions C1, C2, including piezosensitive device P, previously explained. Thus, based on the process state according to FIG. 6, semiconductor chips SC1''', SC2''', . . . are already thinned and sawed into individual chips SC1''', SC2''', . . . . This composite W1" is held together only by bordered dicing tape SF. Reference character V1''' denotes the first front surface of first composite W1", while reference character R1''' denotes the first back surface of first composite W1".

In contrast to the specific embodiments previously described, in the fourth specific embodiment it is likewise provided that steel carrier substrates SS1''', SS2''', SS3''', . . . are not present in the form of a stainless steel wafer, but rather as individual substrates which are joined as composite W2' with the aid of a carrier device TE as explained in detail in DE 199 34 114 A1, for example. Reference character V2''' denotes the second front surface of composite W2", while reference character R2''' denotes the second back surface thereof.

Following the process state according to FIG. 8, the seal glass bonding, back-side contacting, separation, and the other subsequent process steps previously described in conjunction with the first specific embodiment are carried out.

Figure 9A:
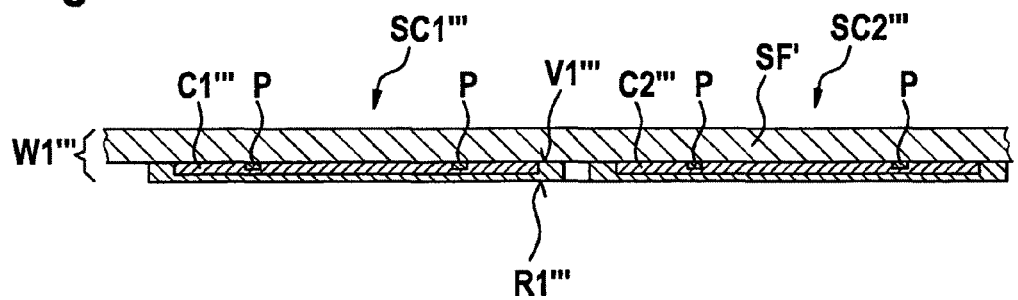
FIGS. 9a, b show schematic cross-sectional views for explaining a manufacturing method for a micromechanical component according to a fifth specific embodiment of the present invention.
Figure 9B:
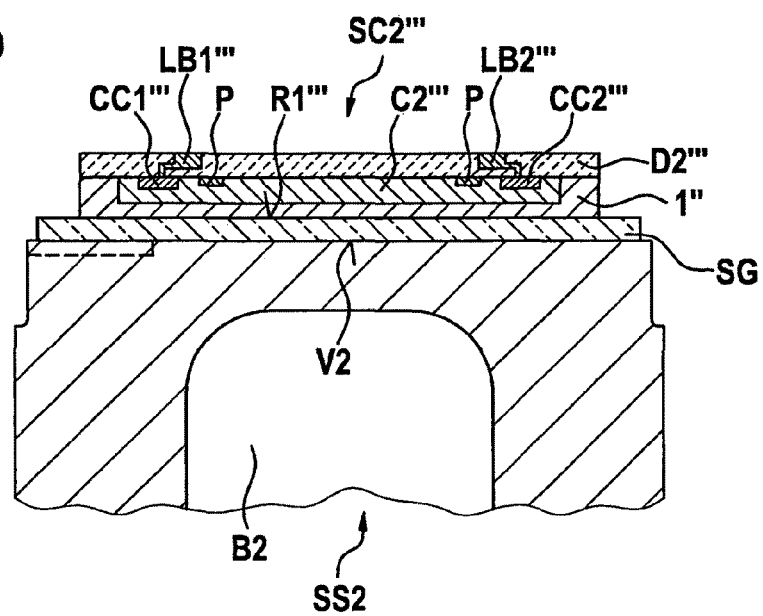

FIGS. 9a, b show schematic cross-sectional views for explaining a manufacturing method for a micromechanical component according to a fifth specific embodiment of the present invention.

In the fifth specific embodiment according to FIGS. 9a, b, thinned and separated sensor chips SC1''', SC2''', . . . are joined via a bordered dicing tape SF' in a composite W1''' which, unlike the fourth specific embodiment, is mounted on first front surface V1''', while its first back surface R1''' is exposed.

Accordingly, first back surface R1''' is soldered at second front surface V2 of steel carrier substrate SS2 to chip SC2''', etc., whose circuit connection regions CC1''', CC2''' of circuit C2''' are connected to front surface V1''' via printed conductors LB1''', LB2''' which extend through thin-layer ceramic D2'''. Printed conductors LB1''', LB2''' may subsequently be electrically connected by bonding or other techniques.

Although the present invention has been described above on the basis of preferred exemplary embodiments, it is not limited thereto, and may be modified in numerous ways.

In particular, the stated material combinations as well as types of sensors are only examples. The above-mentioned specific embodiments may also be combined in any desired manner with regard to the types of composites and types of contacting.

What is claimed is:

1. A method for manufacturing a micromechanical component, comprising:
providing a first composite of a plurality of semiconductor chips, the first composite having a first front surface and a first back surface;
providing a second composite of a corresponding plurality of carrier substrates, the second composite having a second front surface and a second back surface;
applying a structured adhesion promoter layer to at least one of the first front surface and the second front surface, the layer having degassing channels;
aligning the first front surface and the second front surface corresponding to a plurality of micromechanical components, each having a semiconductor chip and a corresponding carrier substrate;
connecting the first front surface and the second front surface via the structured adhesion promoter layer by applying pressure in such a way that each semiconductor chip is connected to a corresponding carrier substrate corresponding to a respective micromechanical component, so that a gas from the ambient atmosphere is able to escape to the outside through the degassing channels; and
separating the micromechanical components.

2. The manufacturing method as recited in claim 1, wherein the first composite is a wafer composite.

3. The manufacturing method as recited in claim 2, wherein the wafer composite is designed in such a way that the semiconductor chips are connected to a main wafer element via one or multiple support points, each of which is surrounded by a cavity.

4. The manufacturing method as recited in claim 3, wherein the connection step includes a thermal step in which the support points break, thus separating the main wafer element from the semiconductor chips.

5. The manufacturing method as recited in claim 1, wherein the first composite is designed in such a way that the plurality of semiconductor chips is provided on a dicing tape.

6. The manufacturing method as recited in claim 1, wherein the second composite is a wafer composite.

7. The manufacturing method as recited in claim 1, wherein the second composite is designed in such a way that the plurality of carrier substrates is connected using a carrier device.

8. The manufacturing method as recited in claim 1, wherein the bonding promoter layer is a seal glass layer which for the connection is heated to a temperature in the range of 100° C. to 500° C.

9. The manufacturing method as recited in claim 1, wherein the bonding promoter layer has a pressure pattern having multiple separate structures having first degassing channels, and the separate structures are separated by second degassing channels.

10. The manufacturing method as recited in claim 1, wherein the carrier substrates are steel substrates.

11. The manufacturing method as recited in claim 1, wherein each semiconductor chip has an integrated circuit on its first front surface, the first front surface being connected to the second front surface via the structured bonding promoter layer.

12. The manufacturing method as recited in claim 11, wherein after the connection and before the separation a step of through contacting of the semiconductor chips, starting from the first back surface, is carried out.

13. The manufacturing method as recited in claim 12, wherein before the through contacting a step of thinning the first composite of the plurality of semiconductor chips at the first back surface is carried out.

* * * * *